United States Patent
Kim

(10) Patent No.: US 11,798,829 B2
(45) Date of Patent: Oct. 24, 2023

(54) OPEN-ENDED TYPE SUBSTRATE RECEIVING CASSETTE AND SYSTEM THEREOF

(71) Applicant: SAMSUNG ELECTRONICS CO., LTD., Suwon-si (KR)

(72) Inventor: Yoon Su Kim, Pyeongtaek-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 140 days.

(21) Appl. No.: 17/207,182

(22) Filed: Mar. 19, 2021

(65) Prior Publication Data
US 2021/0384055 A1    Dec. 9, 2021

(30) Foreign Application Priority Data
Jun. 5, 2020  (KR) .................. 10-2020-0068454

(51) Int. Cl.
*H01L 21/673*       (2006.01)
*B65G 1/14*         (2006.01)

(52) U.S. Cl.
CPC ......... *H01L 21/67309* (2013.01); *B65G 1/14* (2013.01); *H01L 21/6732* (2013.01); *H01L 21/67303* (2013.01)

(58) Field of Classification Search
CPC ......... H01L 21/67309; H01L 21/67303; H01L 21/6732; B65G 1/14
USPC ..................................................... 211/41.18
See application file for complete search history.

(56) References Cited

U.S. PATENT DOCUMENTS

| | | | | |
|---|---|---|---|---|
| 5,169,684 A | * | 12/1992 | Takagi | H01L 21/68735 118/728 |
| 5,534,074 A | * | 7/1996 | Koons | C30B 25/12 211/41.18 |
| 6,098,808 A | * | 8/2000 | Matsuda | H05K 13/0069 206/708 |
| 6,948,623 B2 | * | 9/2005 | Takano | H01L 21/67309 211/41.1 |
| 6,981,594 B1 | * | 1/2006 | Sarver | H01L 21/6732 211/41.18 |
| 7,114,908 B1 | * | 10/2006 | Sarver | H01L 21/67781 414/404 |
| 7,163,110 B2 | * | 1/2007 | Huang | H01L 21/6734 211/41.18 |
| 7,246,708 B2 | * | 7/2007 | Chuang | A47B 81/00 211/41.18 |

(Continued)

FOREIGN PATENT DOCUMENTS

| | | |
|---|---|---|
| JP | 5169738 | 5/2015 |
| JP | 5714319 | 5/2015 |

(Continued)

*Primary Examiner* — Stanton L Krycinski
(74) *Attorney, Agent, or Firm* — F. Chau & Associates, LLC

(57) ABSTRACT

A cassette which receives a substrate, and a substrate receiving system including a chamber which receives a cassette in which a substrate is loaded are provided. The cassette which receives a substrate includes: a plurality of slot supports stacked in a first direction; and a frame connected to the plurality of slot supports and extending in the first direction, wherein the plurality of slot supports and the frame are opened in an outward direction to receive the substrate, and are closed in an inward direction after the substrate is received.

20 Claims, 20 Drawing Sheets

(56) References Cited

U.S. PATENT DOCUMENTS

| | | | |
|---|---|---|---|
| 7,694,690 B2* | 4/2010 | Yen | B08B 3/044 |
| | | | 211/41.18 |
| 7,748,542 B2* | 7/2010 | Yudovsky | H01L 21/67757 |
| | | | 211/41.18 |
| 7,857,140 B2* | 12/2010 | Shinjo | H01L 21/6732 |
| | | | 211/41.18 |
| 7,900,579 B2* | 3/2011 | Inoue | H01L 21/67109 |
| | | | 257/E21.705 |
| 8,397,917 B2* | 3/2013 | Kasama | H01L 21/67383 |
| | | | 211/41.18 |
| 8,905,239 B2* | 12/2014 | Kim | H01L 21/6735 |
| | | | 211/41.18 |
| 9,022,717 B2* | 5/2015 | Liu | H01L 21/67259 |
| | | | 414/331.04 |
| 9,656,797 B2* | 5/2017 | Hong | H01L 21/6734 |
| 9,691,647 B2* | 6/2017 | Wang | H01L 21/67309 |
| 9,714,135 B2* | 7/2017 | Kamata | B65D 88/546 |
| 10,242,899 B2* | 3/2019 | Kuo | H01L 21/67379 |
| 10,340,166 B2* | 7/2019 | Guo | H01L 21/67309 |
| 10,910,247 B2* | 2/2021 | Honsho | H01L 21/67373 |
| 2002/0113027 A1* | 8/2002 | Minami | H01L 21/67303 |
| | | | 211/41.18 |
| 2006/0226094 A1* | 10/2006 | Cho | B65G 49/062 |
| | | | 211/41.18 |
| 2006/0231515 A1* | 10/2006 | Chou | H01L 21/67303 |
| | | | 211/41.18 |
| 2011/0076117 A1* | 3/2011 | Iizuka | H01L 21/67748 |
| | | | 414/217 |
| 2011/0100937 A1* | 5/2011 | Mohamed | H01L 21/6732 |
| | | | 211/41.18 |
| 2012/0258414 A1* | 10/2012 | Matsuura | H01L 21/67309 |
| | | | 432/5 |
| 2013/0082015 A1* | 4/2013 | Zhao | H01L 21/67386 |
| | | | 211/41.18 |

FOREIGN PATENT DOCUMENTS

| | | |
|---|---|---|
| KR | 10-0247138 | 3/2000 |
| KR | 10-0489910 | 9/2005 |
| KR | 10-0554631 | 2/2006 |
| KR | 1020070002675 | 1/2007 |
| KR | 10-0708216 | 4/2007 |
| KR | 10-0977593 | 8/2010 |
| KR | 10-1162032 | 7/2012 |
| KR | 10-1279941 | 7/2013 |

* cited by examiner

OPEN-ENDED TYPE SUBSTRATE RECEIVING CASSETTE AND SYSTEM THEREOF

CROSS-REFERENCE

This application claims priority under 35 U.S.C. § 119 to Korean Patent Application No. 10-2020-0068454, filed on Jun. 5, 2020, the disclosure of which is incorporated by reference in its entirety.

FIELD

The present disclosure relates to semiconductor fabrication, and more particularly relates to an open-ended type substrate receiving cassette and a system thereof.

DISCUSSION OF RELATED ART

One type of fabrication equipment for a semiconductor device is batch-type fabricating equipment. A cassette in which substrates are loaded may be used to process a plurality of substrates, such as wafers, in a single process using such batch-type fabricating equipment. Specifically, a cassette in which the substrates are loaded may itself be loaded into an inside chamber of the batch-type fabricating equipment to perform the process. A predetermined number of substrates may be loaded vertically in the cassette, while maintaining a constant interval or height pitch between substrates within the cassette.

SUMMARY

In order to increase the number of substrates that the cassette is able to receive, the height pitch may be minimized between slot supports in the cassette that support the substrates.

Embodiments of the present disclosure may provide a cassette in which a frame and a slot support included in a cassette for receiving a substrate can be opened and closed to minimize a height pitch between the slot supports inside the cassette.

Embodiments of the present disclosure may provide a substrate receiving system in which a frame and a slot support included in a cassette for receiving a substrate can be opened and closed to minimize a height pitch between the slot supports inside the cassette.

However, embodiments of the present disclosure are not restricted to those set forth herein. The above and other embodiments of the present disclosure will become more apparent to those of ordinary skill in the art to which the present disclosure pertains by referencing the detailed description of the present disclosure given below.

According to an embodiment of the present disclosure, there is provided a cassette which receives a substrate, comprising: a plurality of slot supports stacked in a first direction; and a frame connected to the plurality of slot supports and extending in the first direction, wherein the plurality of slot supports and the frame are opened in an outward direction to receive the substrate, and are closed in an inward direction after the substrate is received.

According to an embodiment of the present disclosure, there is provided a substrate receiving system including a chamber which receives a cassette in which a substrate is loaded, the cassette includes a plurality of slot supports stacked in a first direction, and a frame connected to the plurality of slot supports and extending in the first direction, and the plurality of slot supports and the frame are opened in an outward direction to receive the substrate, and closed in an inward direction after the substrate is received.

According to an embodiment of the present disclosure, there is provided a cassette which receives a substrate, comprising: a plurality of slot supports stacked in a first direction; and a frame connected to the plurality of slot supports and extending in the first direction, wherein some of the plurality of slot supports are opened in an outward direction, and the substrate is loaded onto some other of the plurality of slot supports, and after the substrate is loaded, some of the plurality of slot supports are closed in an inward direction along which the substrate is loaded to press at least a part of the substrate.

BRIEF DESCRIPTION OF THE DRAWINGS

The above and other embodiments of the present disclosure will become more apparent by describing in detail exemplary embodiments thereof with reference to the attached drawings, in which.

DETAILED DESCRIPTION

Figure 1:
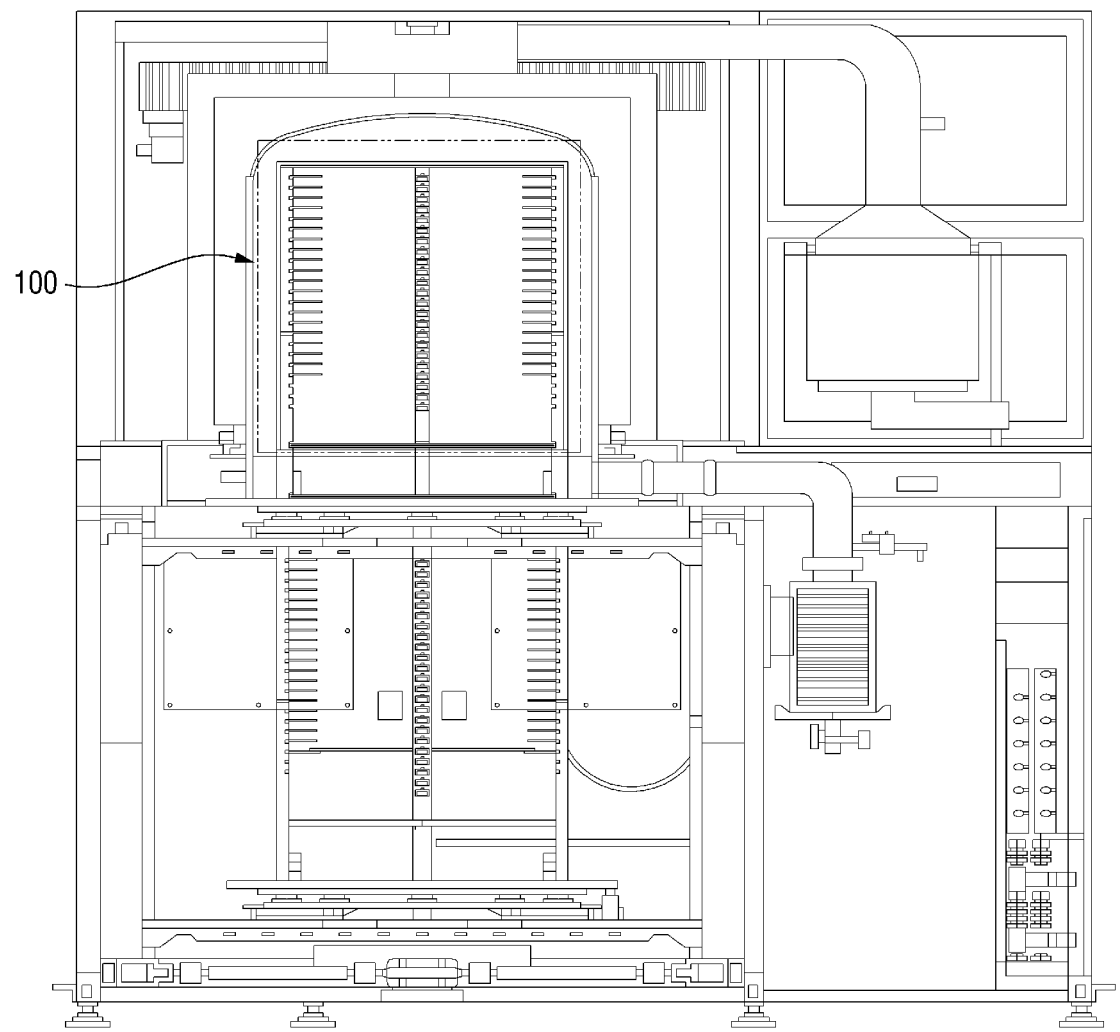
FIG. 1 is a schematic diagram showing a substrate receiving system including a cassette according to an exemplary embodiment.

FIG. 1 illustrates a substrate receiving system including a cassette according to an exemplary embodiment.

Referring to FIG. 1, a substrate receiving system including a cassette 100 according to an exemplary embodiment includes a chamber 1.

The chamber 1 of the substrate receiving system according to an exemplary embodiment may include a batch-type cassette 100.

A semiconductor device may be fabricated through the chamber 1. For example, a fabricating process of the semiconductor device using thermal energy may be performed through the chamber 1. The fabricating process of the semiconductor device using thermal energy may be, for example, diffusion, etching, oxidation, chemical vapor deposition (CVD), or the like. The semiconductor fabricating process performed through the chamber 1 of the substrate receiving system is not limited thereto.

The shapes of the chamber 1 and the cassette 100 according to alternate embodiments are not limited to those of the exemplary embodiments depicted in the drawings.

The fabricating process of the semiconductor device performed by the chamber 1 of the substrate receiving system according to an exemplary embodiment may be performed on the substrate received by the cassette 100. The cassette 100 according to an exemplary embodiment may receive a plurality of substrates, and may transport the plurality of substrates to the chamber 1 through the cassette 100 at once. Also, the cassette 100 according to an exemplary embodiment may receive a plurality of substrates, such as one for each of the cassette's plurality of slot supports.

The cassette 100 according to an exemplary embodiment is separated from the chamber 1, and may be received in a plurality of chambers 1 after receiving the substrates (e.g., wafers) outside the chamber 1. This will be explained through FIG. 2.

Figure 2:
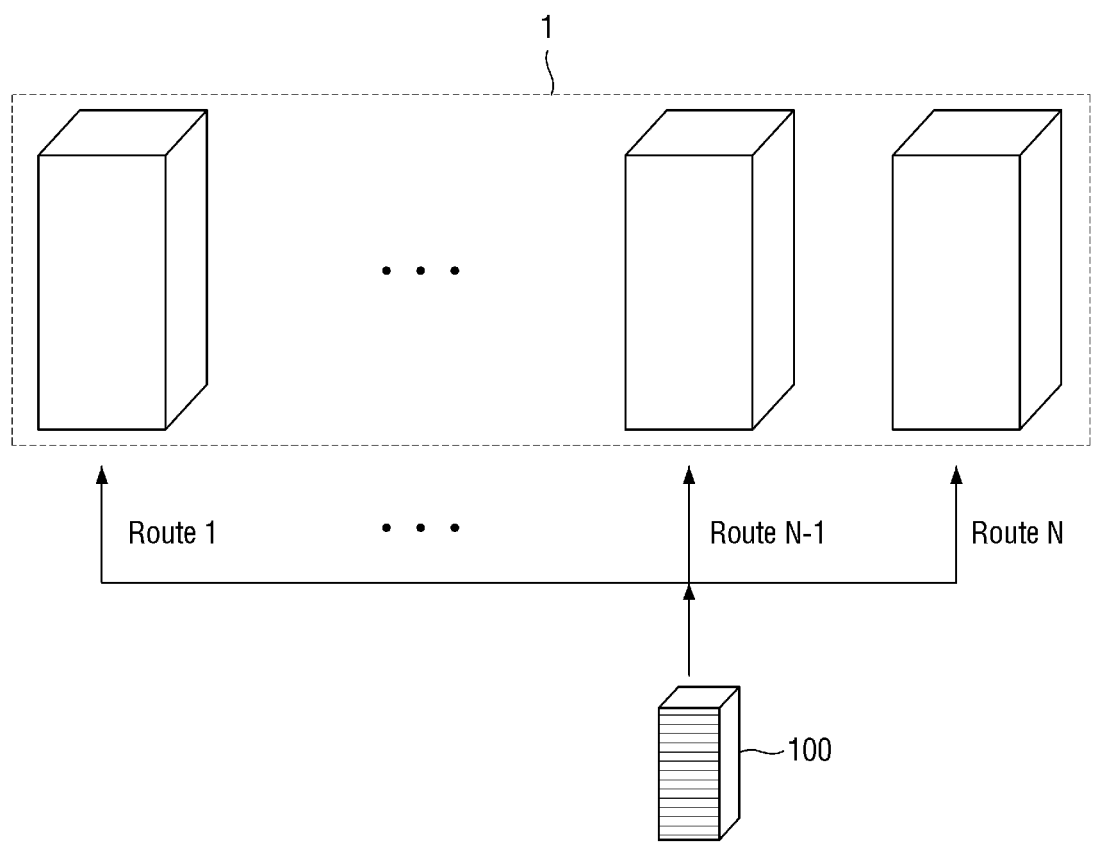
FIG. 2 is a conceptual diagram showing a plurality of chambers which receive the cassettes according to an exemplary embodiment.

FIG. 2 illustrates a plurality of chambers which receive the cassettes according to an exemplary embodiment.

The substrate receiving system according to an exemplary embodiment may include a plurality of chambers 1. Each cassette 100 for receiving the substrates may receive the substrates outside of the plurality of chambers 1, and then each populated cassette may be inserted into each requested chamber 1.

For example, the processing of substrates may be performed in N chambers 1 (where N means a natural number of 1 or more throughout this disclosure). If the substrates are loaded by being disposed in cassettes within each of the N chambers 1, the process time may be increased. However, if the cassette 100 according to an exemplary embodiment is placed outside the chamber 1 and then the substrates are loaded on the cassette 100 before being inserted into each chamber 1, the process time may be reduced.

More specifically, when there is a request for a process through the chamber located in a first route Route 1 among the plurality of chambers 1, the substrates are loaded in the cassette 100 and the cassette 100 may be moved through the first route Route 1. In another example, when there is a request for a process through the chamber located in a N−1th route Route N−1 among the plurality of chambers 1, the substrates are loaded in the cassette 100, and the cassette 100 may be moved through the N−1th route Route N−1. In still another example, when there is a request for a process through the chamber located in a Nth route Route N among the plurality of chambers 1, the substrates are loaded in the cassette 100, and the cassette 100 may be moved through the Nth route Route N.

The number, shape, and arrangement of the chambers according to an exemplary embodiment, and the movement route of the cassette 100 through one or more routes and/or chambers, are merely shown as an example and not limited thereto. Hereinafter, the cassette 100 according to an exemplary embodiment will be mainly explained.

Figure 3:
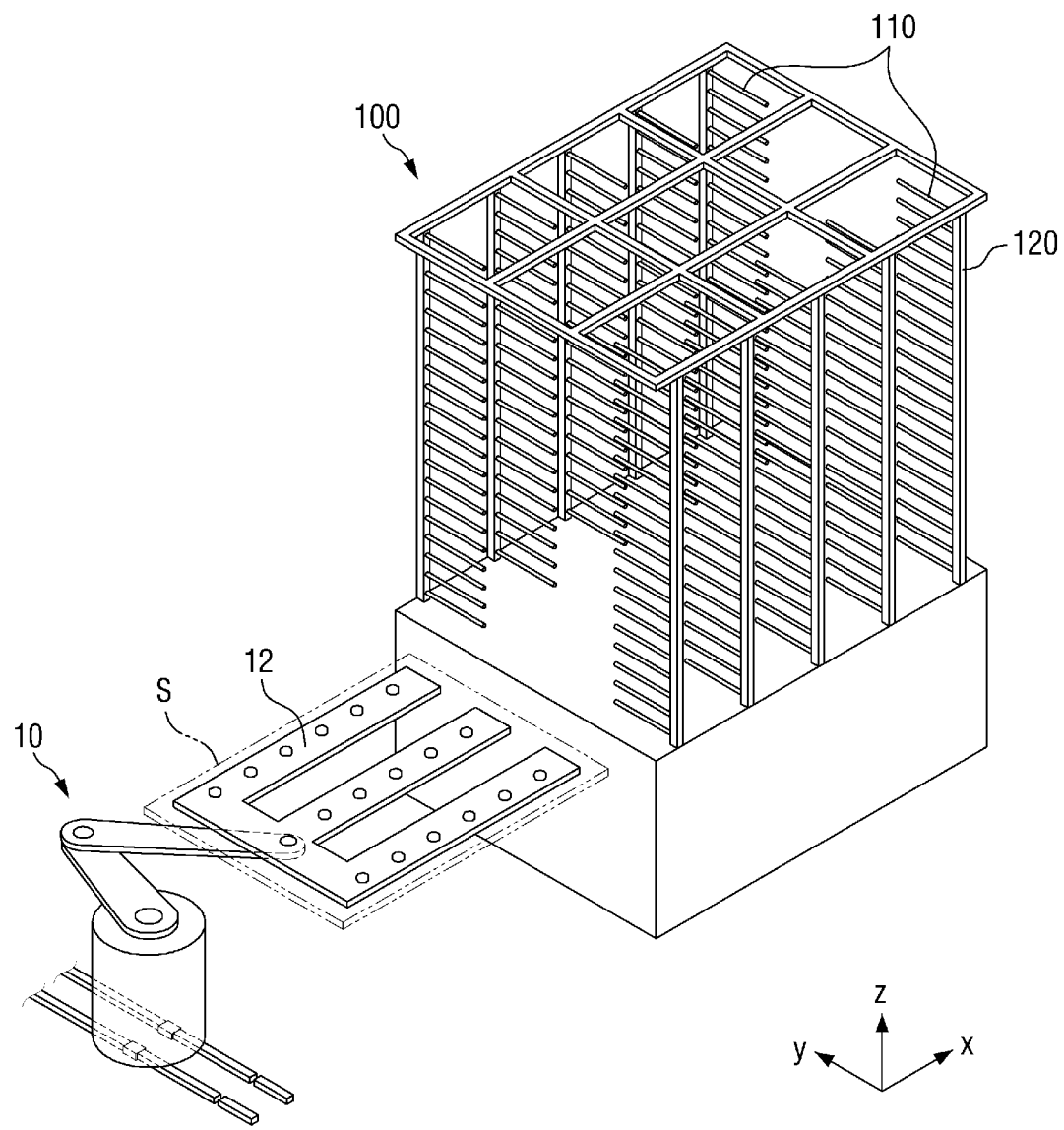
FIG. 3 is a schematic diagram showing a cassette receiving the substrates according to an exemplary embodiment.

FIG. 3 illustrates a cassette receiving the substrates according to an exemplary embodiment.

The cassette 100 according to an exemplary embodiment includes a frame 120 and a slot support rail 110. The frame 120 according to an exemplary embodiment is a constituent element that forms an outer framework of the cassette 100, and may define an overall shape of the cassette 100 on which substrates can be loaded. The slot support rail 110 according to an exemplary embodiment is a constituent element that directly comes into contact with the substrate to support the substrate, and presses the substrate 120, when the substrates are loaded in the cassette 100, and the slot support rail 110 may be placed horizontally with the substrate over both sidewalls of the frame 120.

The frame 120 may be made of a material having excellent hardness or rigidity to maintain the shape of the cassette 100. Alternatively, the frame 120 may be made of a material that may be bent like an elastic material to provide a sufficient space when the cassette 100 loads the substrates. The slot support rail 110 may be made of a material having a hardness lower than that of the substrate to prevent damage to the substrate in the process of coming into contact with the substrate.

A plurality of slot support rails 110 may be spaced apart from each other by a substantially same interval between the slot support rails 110 adjacent to each other in a third direction z to form a multilayer. At this time, the interval between the slot support rails 110 in the third direction z may have a dimension adequate to carry the substrates into the upper part of the slot support rail 110 or carry out the substrates supported on the upper part of the slot support. For example, a robot hand 12 of the transportation robot 10 mounts the substrate S and enters between the slot support rails 110. After that, the robot hand 12 of the transportation robot 10 may lower the mounted substrate S and place it on the slot support rail 110. The substrate S may be disposed above or below the robot hand 12, and is shown here in phantom view. For reference, the shape of the transportation robot 10 is not limited thereto.

Therefore, the interval between each of the plurality of slot support rails 110 may be placed in consideration of a plurality of factors. The interval between each of the plurality of slot support rails 110 will be described, while viewing in a first direction x through FIG. 4.

Figure 4:
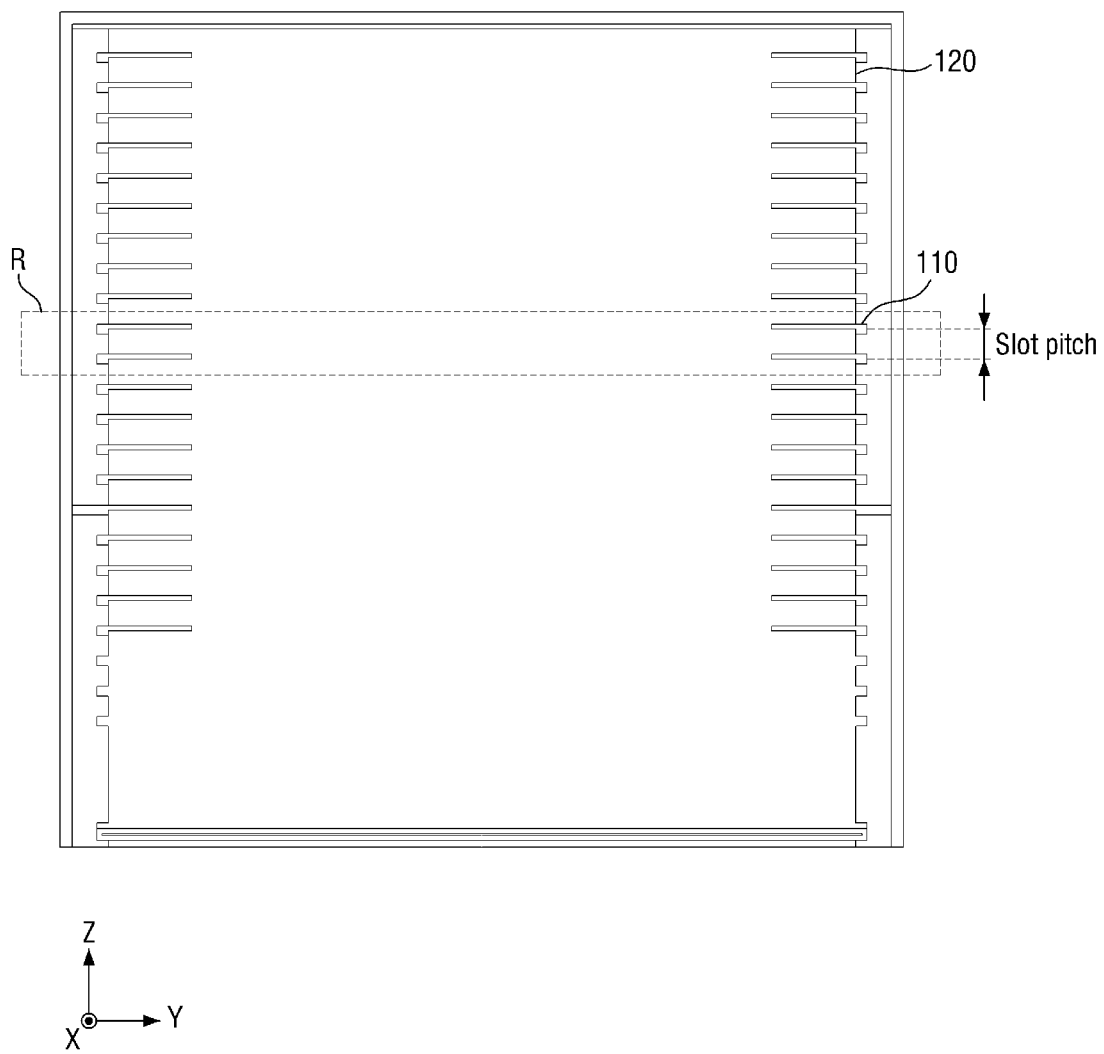
FIG. 4 is a cross-sectional diagram view of a cassette according to an embodiment of FIG. 3 as viewed in a first x-axis direction.

FIG. 4 illustrates a cross-sectional view of a cassette according to an exemplary embodiment as viewed in the first direction (x direction).

Referring to FIG. 4, a plurality of slot support rails 110 according to an exemplary embodiment are sequentially stacked in a third direction z. The plurality of slot support rails 110 are connected to the frame 120 extending in the third direction z.

The slot support rails 110 according to an exemplary embodiment are spaced apart from each other at a substantially constant interval (a slot pitch) in the third direction z. The shape of the slot support rail 110 is not limited to that depicted in the drawing, and may have a stepped shape. In the following drawings, the slot support rail 110 will be described as having a stepped shape. However, it is a matter of course that the shape of the slot support rail 110 is not limited thereto.

The interval (slot pitch) between the plurality of slot support rails 110 may be configured in consideration of a plurality of factors, and this will be explained in detail by enlarging a region R, as shown by example through the following FIGS. 5 to 7, but without limitation thereto.

Figure 5:
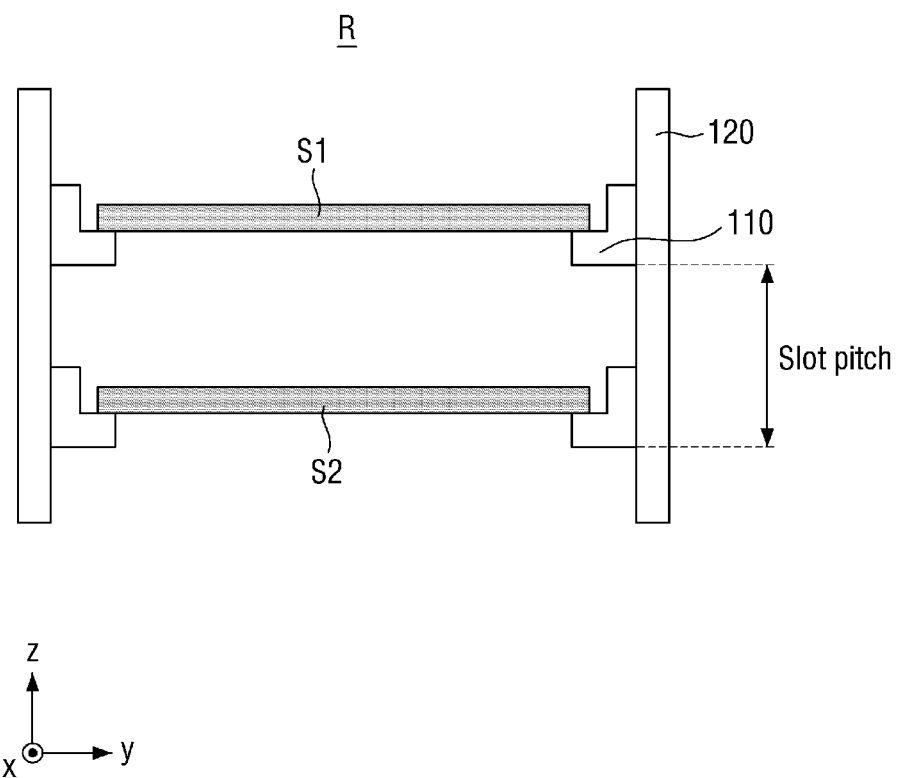
FIG. 5 is a schematic diagram showing a partial region of FIG. 4 including a cassette that receives substrates as an example.

FIG. 5 illustrates a partial region of a cassette that receives substrates, as an example.

Referring to FIG. 5, a plurality of frames 120 extending in the third direction z are disposed to be spaced apart from each other in a second direction y.

A plurality of slot support rails 110 protruding in an inward direction x, in which substrates are loaded in the plurality of frames 120, may be connected to each of the plurality of frames 120. The plurality of slot support rails 110 may support a plurality of substrates (e.g., S1 and S2).

Here, the plurality of slot support rails 110 may have an interval of a slot pitch in the third direction z. The slot pitch may be defined in consideration of a plurality of factors generated in the process of loading the substrates in the plurality of slot support rails 110. A plurality of factors that may be taken into consideration when the slot pitch is defined will be exemplarily described through FIG. 6.

Figure 6:
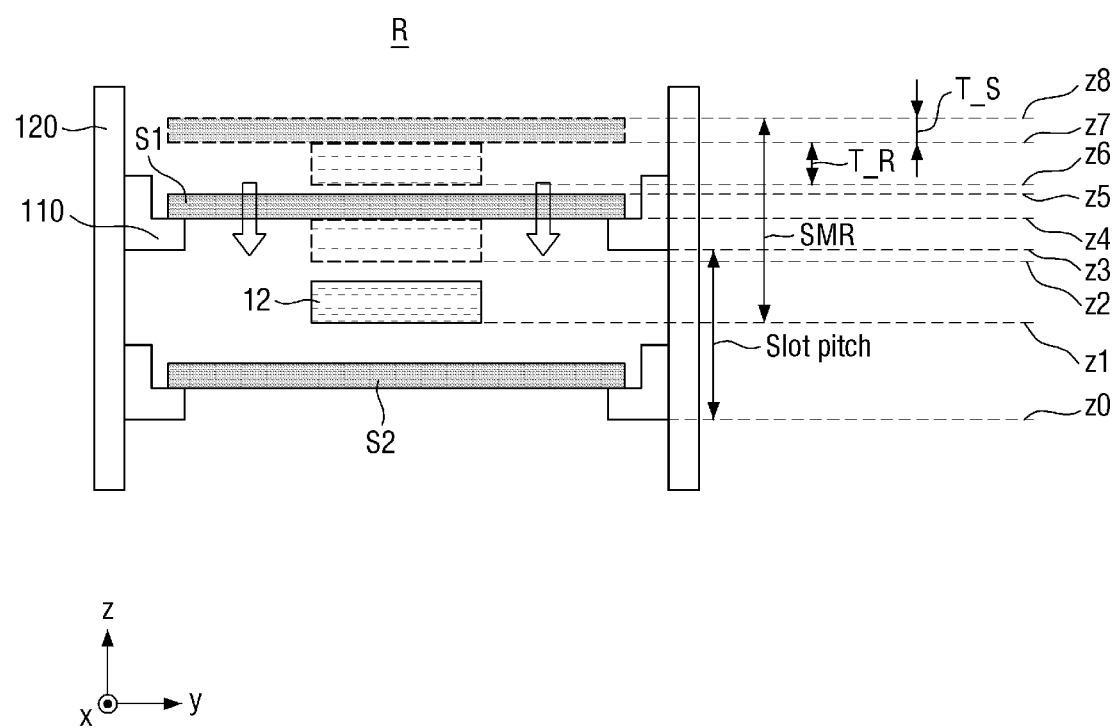
FIG. 6 is a schematic diagram for explaining a process of loading the substrates in the cassette of FIG. 5.

FIG. 6 illustrates a process of loading the substrates in the cassette.

Referring to FIG. 6, in order to load the substrates in the cassette 100, a robot hand 12 for transporting the substrates enters between a plurality of frames 120, together with the substrates. Explanation will be made through FIG. 6 on the assumption that the loaded substrate is an S1 substrate, without limitation thereto.

Although a height (slot pitch) in the third direction z between the plurality of slot support rails 110 is shown as an interval between lowermost faces (e.g., z0 and z3) of each of the plurality of slot support rails 110 in the third direction z, the height (slot pitch) in the third direction z between the plurality of slot support rails 110 is not limited thereto but may be a height between the same parts of each of the plurality of slot support rails 110. For example, the height (slot pitch) in the third direction z between the plurality of slot support rails 110 may be an interval between the uppermost faces of each of the plurality of slot support rails 110 in the third direction z. Explanation will be made on the assumption that the height (slot pitch) in the third direction z between the plurality of slot support rails 110 is an interval between the lowermost faces of each of the plurality of slot support rails 110 in the third direction z, without limitation thereto.

To set the height (slot pitch) in the third direction z between the plurality of slot support rails 110, for example, a thickness $T\_S$ of the substrate S1 may be taken into consideration. The thickness $T\_S$ of the substrate S1 may be, for example, a distance between a lower face z7 of the substrate S1 in the third direction z and an upper face z8 of the substrate S1 in the third direction z. The thicknesses of the plurality of substrates (e.g., S1 and S2) may be the same or different from each other. If the thicknesses of the plurality of substrates are the same, the interval (slot pitch) between the plurality of slot support rails 110 may be defined in consideration of at least some (e.g., S1 or S2) of the plurality of substrates. If the thicknesses of the plurality of substrates (e.g., S1 and S2) are different from each other, the interval (slot pitch) between the plurality of slot support rails 110 may be defined in consideration of the thickness of the thickest substrate.

To set the height (slot pitch) in the third direction z between the plurality of slot support rails 110, for example, the thickness $T\_R$ of the robot hand 12 may be taken into consideration. The thickness $T\_R$ of the robot hand 12 may be, for example, a distance between a lower face z6 of the robot hand 12 in the third direction z and the upper face z7 of the robot hand 12 in the third direction z. The upper face z7 of the robot hand 12 in the third direction z may be a position which is in contact with the lower face (e.g., z7) of the substrate (e.g., S1) in the third direction z. Further, the lower face z6 of the robot hand 12 in the third direction z may be the highest height among the heights at which the robot hand 12 enters in the inward x direction between the plurality of frames 120.

That is, to set the height (slot pitch) in the third direction z between the plurality of slot support rails 110, it is possible to consider the highest position between the plurality of frames 120 of the robot hand 12 that enters the inward direction between the plurality of frames 120. To prevent the substrate (e.g., S2) transported by the robot hand 12 from colliding with another substrate (e.g., S1) or some of the plurality of slot support rails 110 between the plurality of frames 120, the interval (slot pitch) between the plurality of slot support rails 110 may be defined in consideration of a sufficient margin.

The robot hand 12 may load the substrate S1 on some of the plurality of slot support rails 110. At this time, the edge of the substrate S1 joins some of the plurality of slot support rails 110 at a fourth position z4 in the third direction. The upper face of the substrate S1 may be located at a fifth position z5 that is higher than the fourth position z4 by the thickness $T\_S$ of the substrate S1.

The robot hand 12 may stop the loading operation of the substrate S1 and separate from the substrate S1. That is, after the robot hand 12 is separated from the substrate S1, the lower face of the robot hand 12 may move from the second position z2 to the first position z1. The robot hand 12 may move to the first position z1 to finish the loading operation of the substrates S1 and get out of the inside of the plurality of frames 120. That is, after the robot hand 12 is separated from the substrate S1 and then moves to a position (e.g., the first position z1) for preventing collision with another substrate S2, the robot hand 12 may get out of the plurality of frames 120 or the cassette 100. The interval (slot pitch) between the plurality of slot support rails 110 may be defined in consideration of a sufficient margin for the operation of the robot hand 12 to get out of the cassette 100 after finishing the loading operation of the substrate (e.g., S1).

As described above, the thickness $T\_R$ of the robot hand 12, the thickness $T\_S$ of the substrate (e.g., S1), the operation margin sections z2 to z1 after the loading operation of the robot hand 12, may all be taken into consideration to define the interval (slot pitch) between the plurality of slot support rails 110. This will be explained through Formula 1 as follows:

$$\text{Slot pitch} \approx T\_R + T\_S + [\text{lower face } z2 \text{ when the robot hand loads the substrate} - \text{lower face } z1 \text{ at the time of escaping operation after the robot hand loads the substrate}] \quad \text{(Formula 1)}$$

Factors for defining the interval (slot pitch) between the plurality of slot support rails 110 are not limited thereto. For example, in order to determine the interval (slot pitch) between the plurality of slot support rails 110, the thickness of the warpage occurring in the substrate may also be taken into consideration. This will be explained in detail through FIG. 7.

Figure 7:
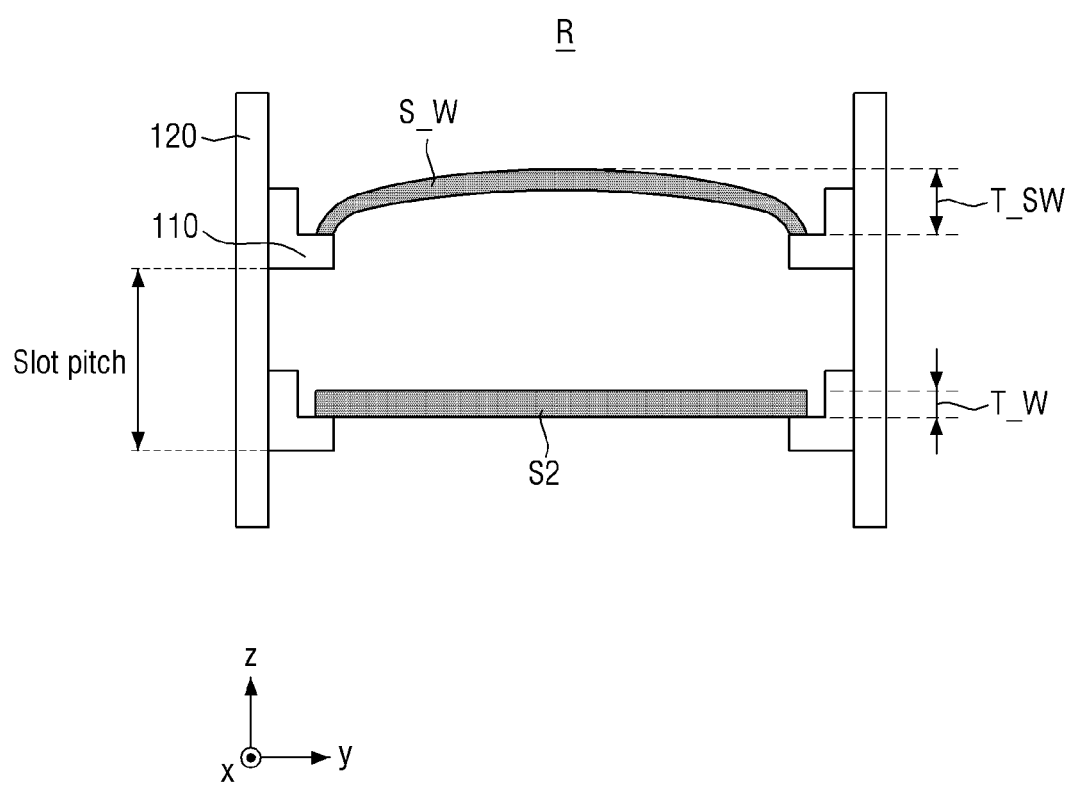
FIG. 7 is a schematic diagram for explaining a case in which a warpage occurs on the substrate loaded in the cassette of FIG. 6.

FIG. 7 illustrates a case in which a warpage occurs on the substrate loaded in the cassette.

Referring to FIGS. 6 and 7, since the warpage occurs on the substrate S_W, a larger thickness margin T_SW may be required as compared to the substrate S2 on which no warpage occurs. For reference, the warpage may be a phenomenon in which the package is twisted in a specific direction due to the multi-layer stack package including a plurality of materials having different thermal expansion coefficients.

Due to the substrate S_W on which the warpage occurs, the margin T_SW for adjusting the interval (slot pitch) between the plurality of slot support rails 110 may be greater than the margin T_W for the wafer or substrate S2 on which no warpage occurs.

When considering even the margin T_SW for determining the slot pitch of the substrate S_W on which the warpage occurs, the slot pitch may be defined by the following Formula 2:

Slot pitch≈T_R+T_SW+[lower face z2 when the robot hand loads the substrate−lower face z1 at the time of escaping operation after robot hand loads the substrate]    (Formula 2)

That is, to define the interval (slot pitch) between the plurality of slot support rails 110, a plurality of factors may be considered. However, when considering the maintenance cost of the chamber, it may be advantageous to load a large number of substrates, while the chamber occupies a small area. To receive a large number of substrates while the chamber occupies a small area, the number of substrates that may be loaded in the cassette may be increased. In order to increase the number of substrates that may be loaded in the cassette, the number of layers of slot supports in the cassette may be increased.

However, if the number of layers of the plurality of slot supports increases, the height of the cassette itself may also increase. As a result, in order to insert or extract the substrate into or from the elevated cassette, the stroke of the transportation robot in the third direction z needs to increase. That is, a range in which the transportation robot moves in the third direction z may further rise. Therefore, there is a problem that the height of the cassette rises, the area of the transportation robot also increases, and the structure of the transportation robot may be complicated. Also, due to the increased height of the cassette, the chamber area may also increase, which may make a maintenance work of the chamber, the cassette, and/or the robot hand difficult.

In addition to this, while the area of the substrate increases, in a state in which the substrate is loaded between the plurality of slot supports in the cassette, a phenomenon may occur in which a central portion of the substrate sags to the lower part in the third direction z. As a result, there is a need to further increase the height (slot pitch) in the third direction z between the plurality of slot support rails 110. As a result, the height of the cassette also rises, and the size of the transportation robot may increase accordingly.

As mentioned above, due to the number of factors taken into consideration to determine the height (slot pitch) in the third direction z between the slot support rails 110, the height of the slot pitch in the third direction z may increase.

Therefore, the frames in the cassette according to an exemplary embodiment may be made to be movable in an inward direction in which the substrates are loaded and in an outward direction opposite to the inward direction, thereby reducing the height of the slot pitch in the third direction z.

In addition, since the slot supports in the cassette according to an exemplary embodiment include at least one protrusion, the substrate is pressured to suppress an occurrence of warpage on the substrate S_W, and it is possible to reduce the margin T_SW for determining the slot pitch due to the substrate S_W on which a warpage occurs.

Hereinafter, a cassette according to an exemplary embodiment will be explained in detail.

Figure 8:
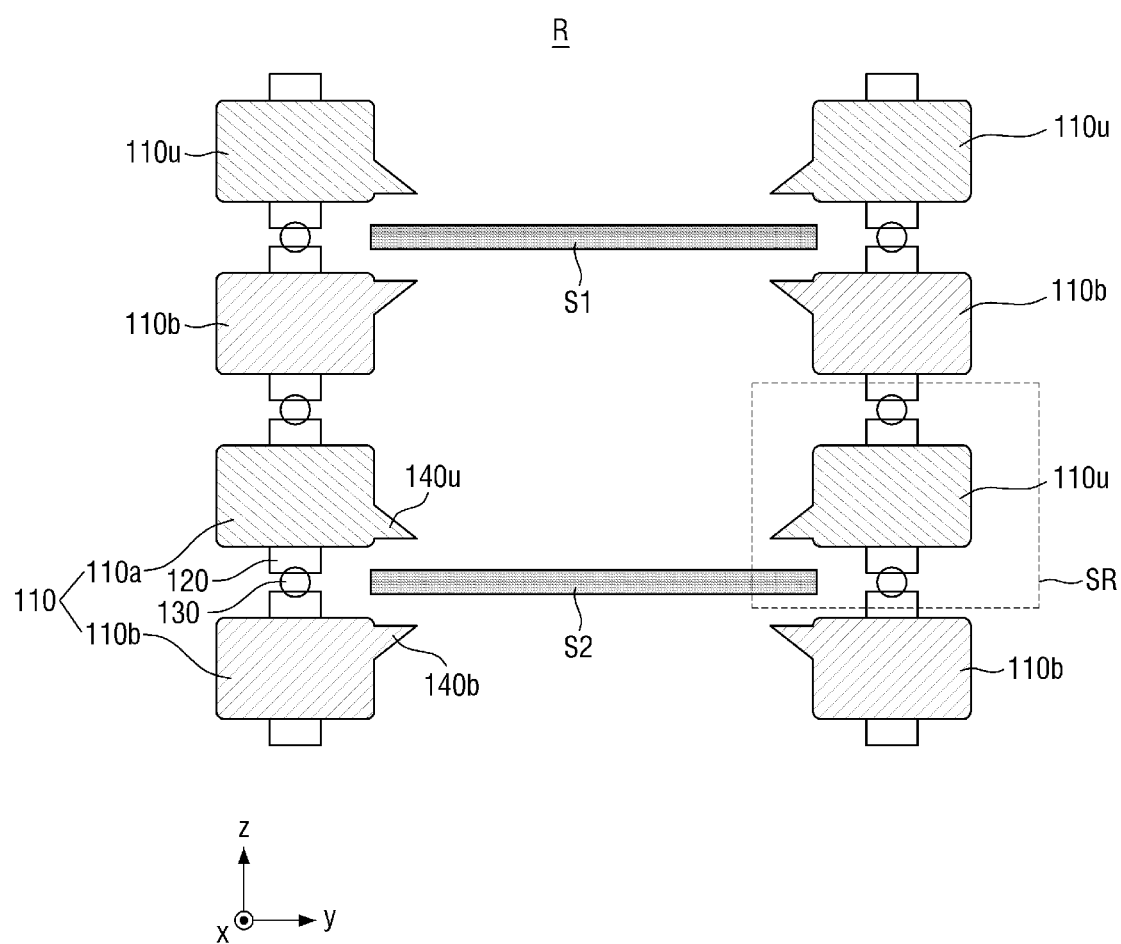
FIG. 8 is a schematic diagram with an enlarged view of a region R for explaining a structure that reduces the height interval between the slot supports in the cassette of FIG. 4 according to an exemplary embodiment.

FIG. 8 illustrates an enlarged view of a region R for explaining a structure that reduces the height interval between the slot supports in the cassette of FIG. 4 according to an exemplary embodiment.

Referring to FIG. 8, the plurality of slot support rails 110 according to an exemplary embodiment includes a lower slot support rail 110b and an upper slot support rail 110u that are sequentially stacked in the third direction z.

The frame connected to the upper slot support rail 110u and the frame connected to the lower slot support rail 110b are connected to each other through a rotating unit 130.

Also, the upper slot support rail 110u includes an upper protrusion 140u. More specifically, the upper protrusion 140u may protrude in the inward direction of the plurality of frames 120 on which substrates (e.g., S2) are loaded. The upper protrusion 140u may be connected to a lower part of the upper slot support rail 110u in the third direction z. After the substrate (e.g., S2) is loaded on some of the plurality of slot support rails 110, the upper protrusion 140u may press the uppermost surface of the substrate (e.g., S2) in the third direction z. The position at which the upper protrusion 140u is connected to the upper slot support rail 110u is not limited to this drawing, and may be located anywhere in the upper slot support rail 110u as long as the upper protrusion 140u may press the upper face of the substrate. Also, the shape of the upper protrusion 140u is not limited to this drawing, and may have any shape as long as the upper protrusion 140u may press the upper face of the substrate.

Also, the lower slot support rail 110b also includes a lower protrusion 140b. More specifically, the lower protrusion 140b may protrude in the inward direction of the plurality of frames 120 on which the substrates (e.g., S2) are loaded. The lower protrusion 140b may be connected to an upper part of the lower slot support rail 110b in the third direction z. The lower protrusion 140b may support the lowermost face of the substrate (e.g., S2) in the third direction z, after the substrate (e.g., S2) is loaded on some of the plurality of slot support rails 110. The position at which the lower protrusion 140b is connected to the lower slot support rail 110b is not limited to this drawing, and the lower protrusion 140b may be located anywhere in the lower slot support rail 110b as long as it may support the lower face of the substrate. Also, the shape of the lower protrusion 140b is not limited to this drawing, and the lower protrusion 140b may have any shape as long as it may support the lower face of the substrate.

The structures of the frames 120 and the plurality of slot support rails 110 in the cassette according to an exemplary embodiment will be described in detail with reference to FIG. 9 in which the region SR is enlarged.

Figure 9:
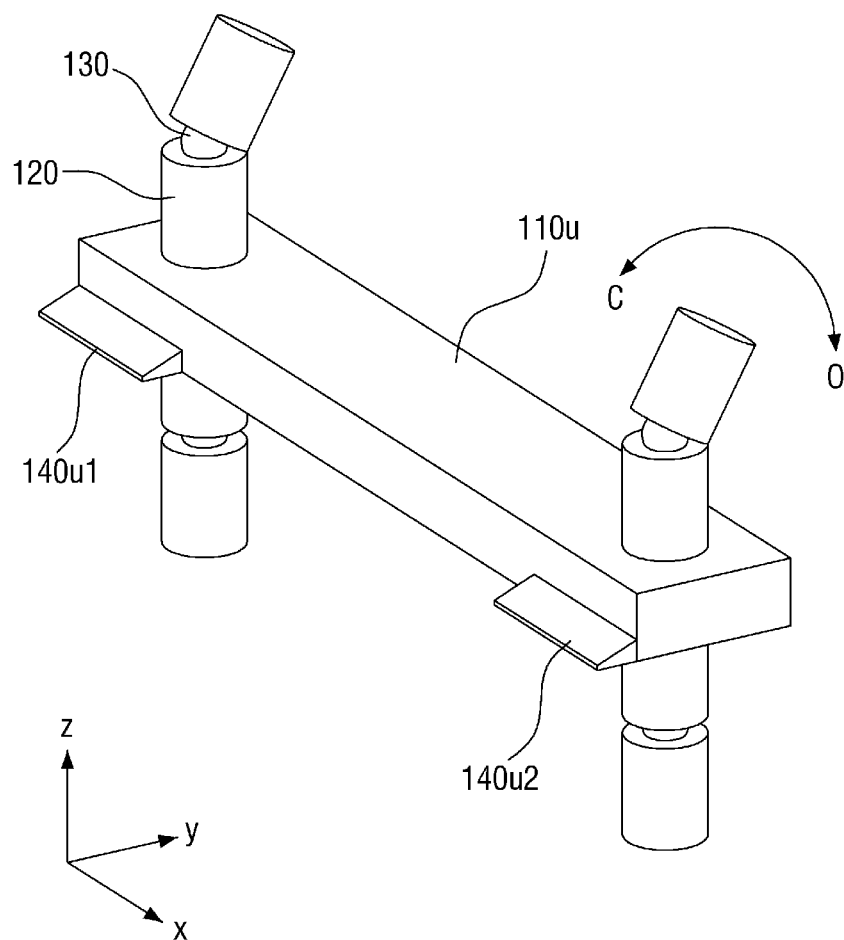
FIG. 9 is a schematic diagram with an enlarged view of an exemplary region SR of the cassette of FIG. 8 according to an exemplary embodiment.

FIG. 9 illustrates an enlarged view of the region SR of the cassette of FIG. 8 according to an exemplary embodiment.

The upper slot support of the slot supports of the cassette according to an exemplary embodiment will be described as an example with reference to FIGS. 8 and 9. The upper slot support rail 110u is connected to a plurality of protrusions (for example, 140u1 and 140u2) on both sides in the first direction x. The plurality of protrusions (for example, 140u1 and 140u2) protrudes in the inward direction in which the substrates are loaded into the plurality of frames 120.

The upper slot support rail 110u and the lower slot support rail 110b, which are sequentially stacked in the third direction z, are connected to the frames, respectively. The frame 120 may be separated into a portion connected to the upper slot support rail 110u and a portion connected to the lower slot support rail 110b. At this time, the frame connected to the upper slot support rail 110u may be connected to the frame connected to the lower slot support rail 110b through the rotating unit 130.

The rotating unit 130 may have a shape in which the frame connected to the upper slot support rail 110u and the frame connected to the lower slot support rail 110b may rotate. For example, the rotating unit 130 may have a circular shape. The shape of the rotating unit 130 is not limited as long as the frame connected to the upper slot support rail 110u and the frame connected to the lower slot support rail 110b may rotate.

That is, since the frame connected to the upper slot support rail 110u and the frame connected to the lower slot support rail 110b are connected through the rotatable rotating unit 130, the frames may be closed in the inward direction C in which the substrates are loaded, or the frames may be opened in the outward direction O.

Since the frame 120 forming the cassette according to an exemplary embodiment is closed in the inward direction C or opened in the outward direction O, when defining the interval (slot pitch) between the plurality of slot support rails 110, the operation margin of the robot hand may not be taken into consideration. This enables the interval (slot pitch) between the plurality of slot support rails 110 to be minimized.

In addition, since the plurality of slot supports forming the cassette according to an exemplary embodiment includes a lower protrusion that supports the substrate and an upper protrusion that presses the substrate, a warpage occurring on the substrate can be minimized. That is, the margin due to the warpage of the substrate may not be taken into consideration, when defining the interval (slot pitch) between the plurality of slot support rails 110. This enables the interval (slot pitch) between the plurality of slot support rails 110 to be minimized.

Hereinafter, the cassette according to an exemplary embodiment which minimizes the interval (slot pitch) between the plurality of slot support rails 110, using the structures of the frame and the slot support according to an exemplary embodiment described above will be described through FIGS. 10 to 14.

FIGS. 10 to 14 illustrate enlarged views of the region R for explaining the operation in which the frame and slot support in the cassette of FIG. 4 may correct wafer or substrate warpage according to an exemplary embodiment.

Figure 10:
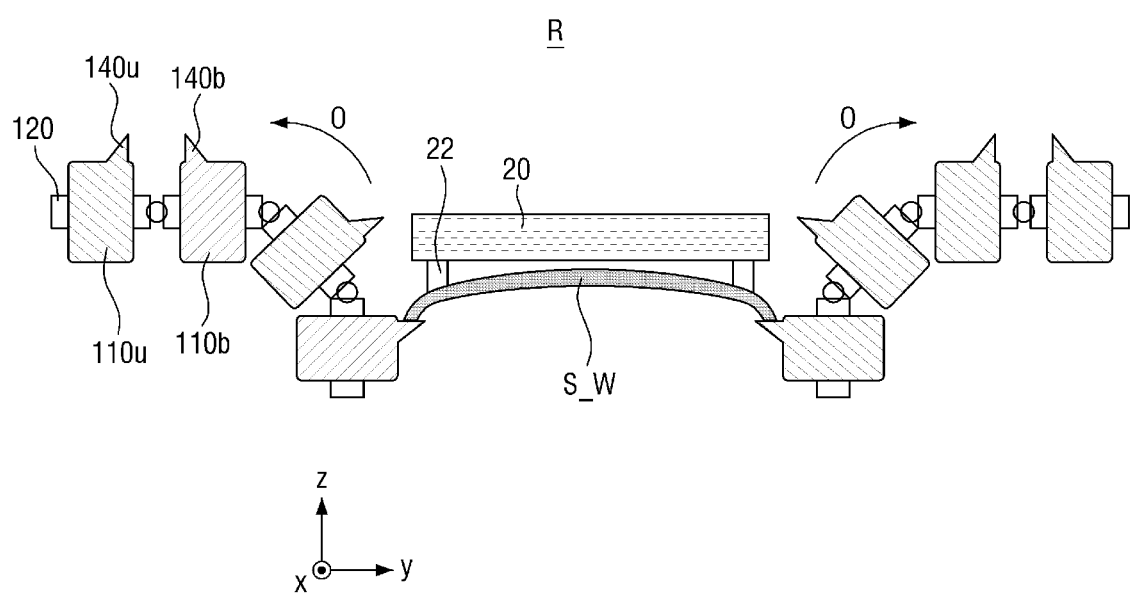
FIGS. 10 to 14 are schematic diagrams with enlarged views of the region R for explaining an operation in which the frame and slot support in the cassette of FIG. 4 may correct warpage according to an exemplary embodiment.

Referring to FIG. 10, in order to load the substrate into the lower slot support rail 110b among a plurality of slot supports (e.g., into a slot defined between slot support rails 110u and 110b), the remaining slot supports and frames on which no substrates are loaded are open in the outward direction O. For reference, the angle and the direction in which the remaining slot supports and the frames on which no substrates are loaded are opened are not limited thereto, and the remaining slot supports and the frames have only to open such that the substrates and the robot hand receiving the substrates may sufficiently move in the inward direction.

When the remaining slot supports and the frames on which no substrate is loaded are opened in the outward direction O, the robot hand transports the substrate. For reference, although the robot hand may transport the substrate while supporting the lower face thereof as shown in FIG. 1, as shown in this drawing, the robot hand may alternatively adsorb and transport by the upper face of the substrate. When the substrate is transported to the cassette according to an exemplary embodiment, in a case of transporting the substrate while adsorbing the upper face thereof using the upper adsorption robot 20 as shown in the drawing, the risk of colliding with other slot supports or substrates present in the lower part in the third direction z may be eliminated.

In the following drawings, explanation may be made on the assumption that the robot hand is the upper adsorption robot 20. In addition, in the following drawings, explanation may be made on the assumption that the substrate is a substrate S_W in which a warpage occurs. It is a matter of course that the explanation in this specification may be applied to a substrate receiving system including the substrate in which no warpage occurs, and/or to a robot hand that transports the substrate while supporting the lower face thereof.

When the substrate S_W in which a warpage occurs is transported in the inward direction of the cassette according to an exemplary embodiment through the upper adsorption robot 20, since the remaining slot supports in which no substrate is loaded open toward the outward direction O, the moving margin (T_R of FIG. 6) of the upper adsorption robot 20 which is taken into consideration in determining the height (slot pitch) in the third direction z between the plurality of slot support rails 110 need not be taken into consideration. That is, the height (slot pitch) in the third direction z between the plurality of slot support rails 110 may be set as shown in Formula 3, in a state in which the moving margin (T_R of FIG. 6) of the upper adsorption robot 20 is excluded.

Slot pitch≈(T_S of FIG. 6)+[lower face (z2 of FIG. 6) when the robot hand loads the substrate−lower face (z1 of FIG. 6) at the time of escaping operation after the robot hand loads the substrate]   (Formula 3)

Hereinafter, referring to FIG. 11, similarly even when the upper adsorption robot 20 loads the cassette S_W in some of the plurality of slot supports, and then gets out of the inside of the cassette according to an exemplary embodiment, since the remaining slot supports and frames on which no substrate is loaded open in the outward direction O, the margin required for the upper adsorption robot 20 to escape after loading the substrate S_W need not be taken into consideration when setting the height (slot pitch) in the third direction z between the plurality of slot support rails 110. That is, when the height (slot pitch) in the third direction z between the plurality of slot support rails 110 is set, the slot pitch may be set in consideration of only the margin (T_SW of FIG. 7) on the substrate S_W in which warpage occurs as in the following Formula 4.

Slot pitch≈(T_SW of FIG. 7)   (Formula 4)

After the substrate S_W is loaded, an operation after the upper adsorption robot 20 escapes the cassette according to an exemplary embodiment will be explained referring to FIG. 12. After the upper adsorption robot 20 loads the substrate S_W or the like on which a warpage occurs into some of the plurality of slot supports, when the upper adsorption robot 20 escapes the cassette according to an exemplary embodiment, the substrate S_W may maintain a status in which a warpage occurs.

However, while some of the plurality of slot supports in which no substrate S_W is loaded is closed in the inward direction C, the upper protrusion 140$u$ of the upper slot support rail 110$u$ may press the upper part of the substrate S_W in which a warpage occurs. That is, since the lower protrusion 140$b$ supports the lower face of the substrate S_W on which a warpage occurs, and the upper protrusion 140$u$ presses the upper face of the substrate S_W on which a warpage occurs, it is possible to minimize a warpage occurring in the substrate S_W.

That is, since the warpage effect of the substrate S_W in which a warpage occurs is removed through the pressure of the upper protrusion 140$u$ that presses the upper face of the edge of the substrate S_W in which a warpage occurs, and the lower protrusion 140$b$ that supports the lower face of the substrate S_W in which a warpage occurs, it is possible to form the substrate S from which the warpage effect is removed.

Therefore, when the height (slot pitch) in the third direction z between the plurality of slot support rails 110 is set, the effect of the margin (T_SW of FIG. 7) on the substrate S_W in which the warpage occurs, which is considered in the above-mentioned Formula 4 may be removed, and the slot pitch can be reduced accordingly.

Figure 11:
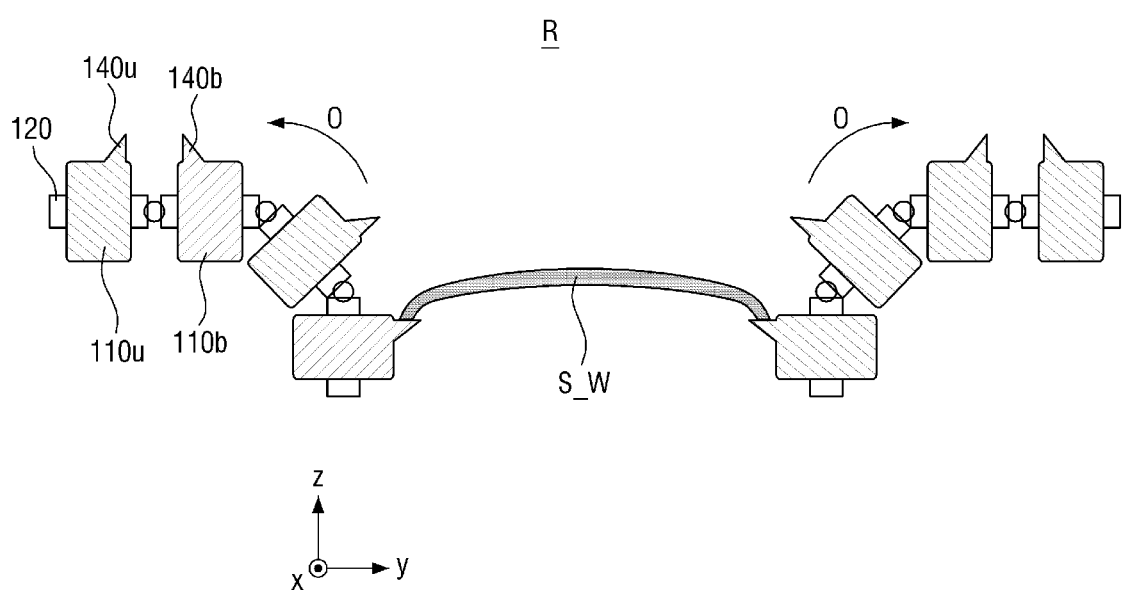
Figure 12:
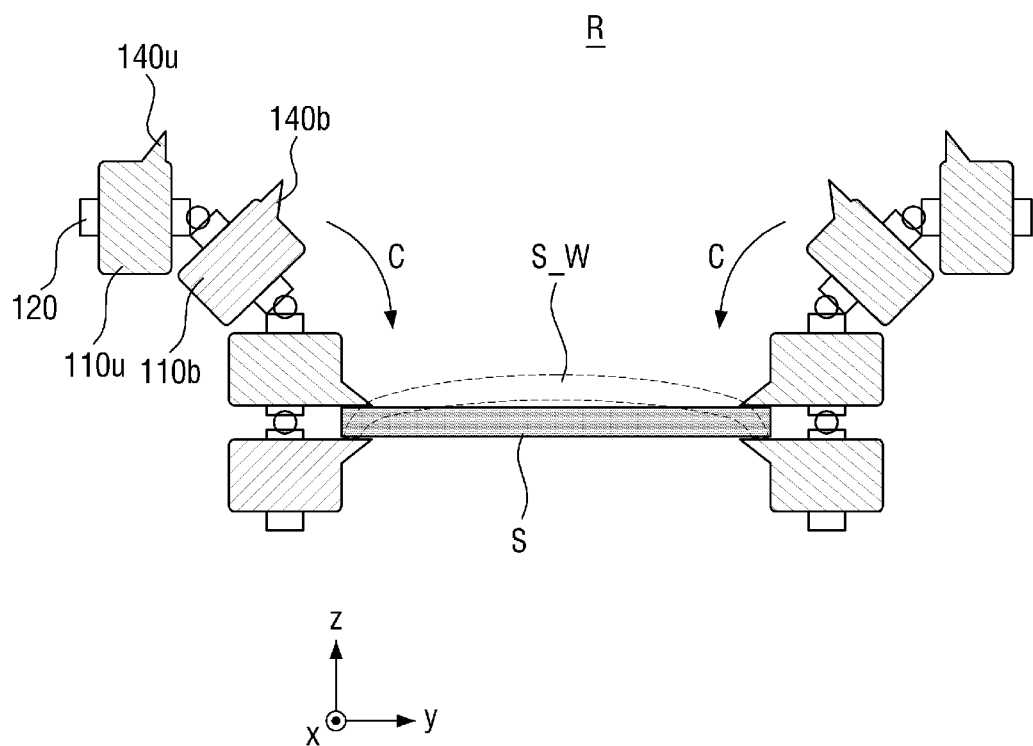
Figure 13:
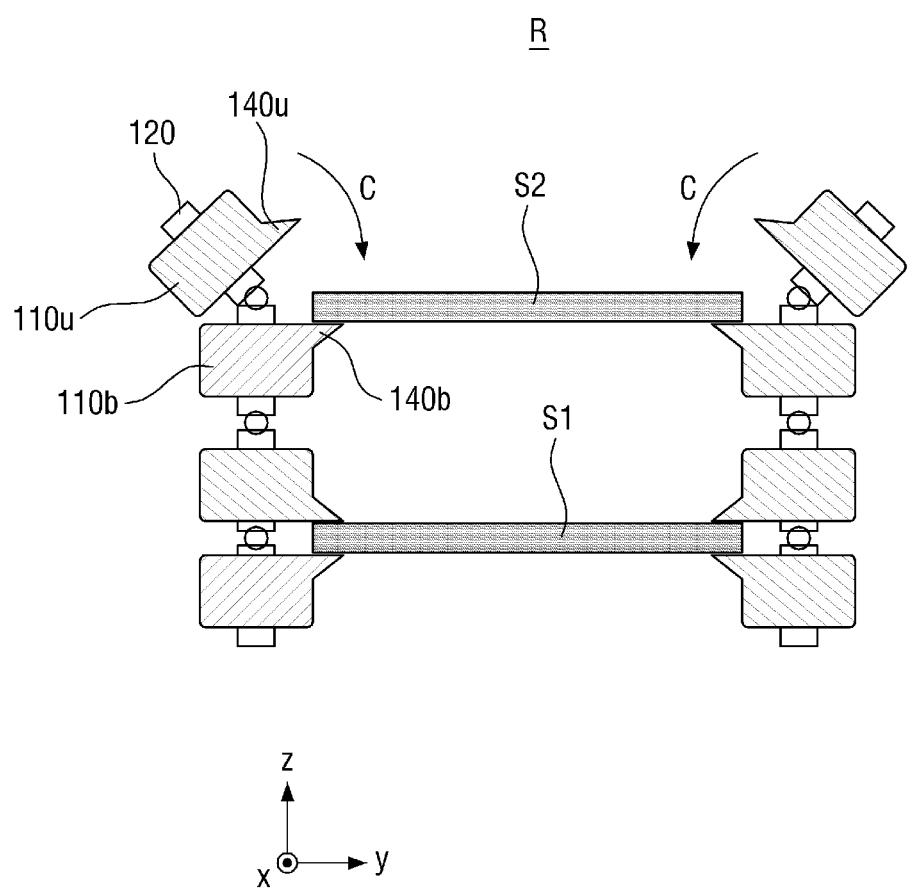

Referring to FIG. 13, another substrate S2 may be loaded into the cassette according to an exemplary embodiment, as described through FIGS. 10 to 12 for the substrate S which may correspond to the substrate S1 of FIG. 13.

Figure 14:
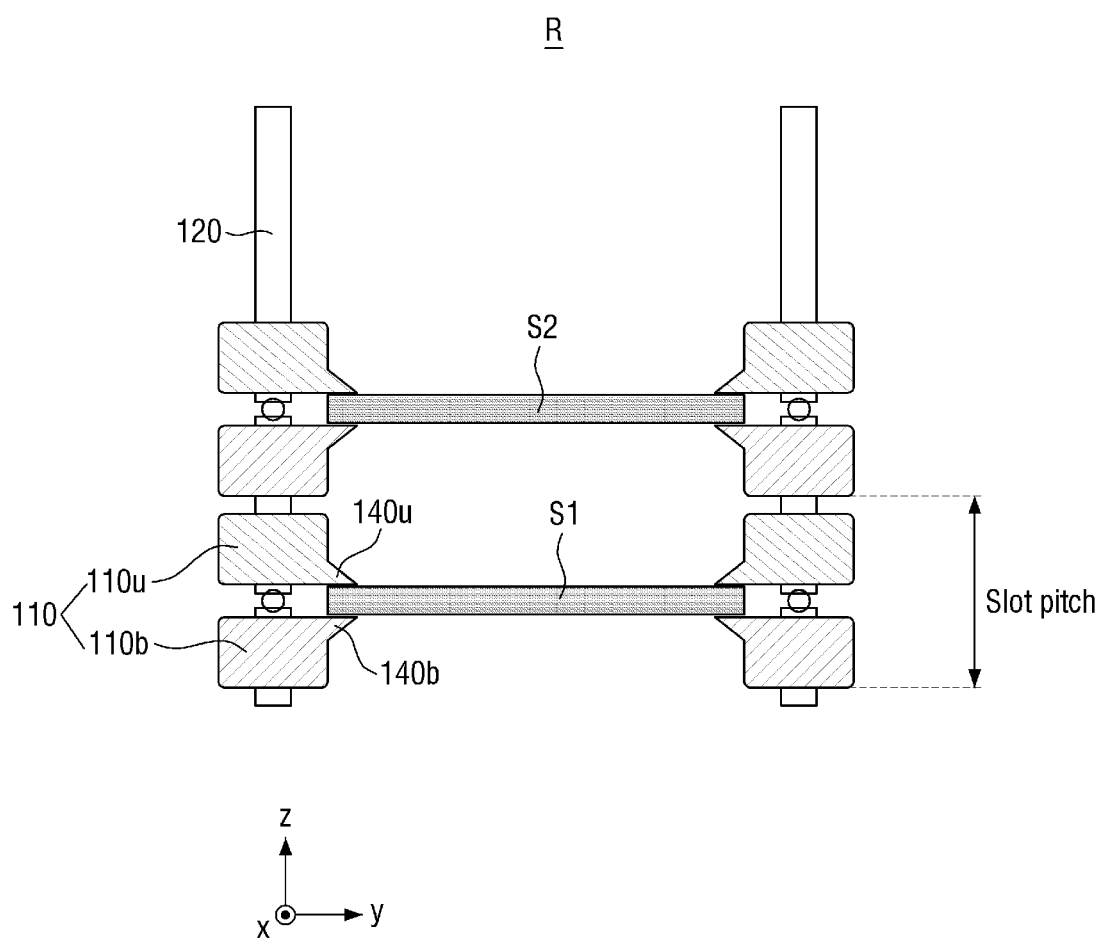

Referring to FIG. 14, after loading a plurality of substrates (e.g., S1 and S2) into the cassette according to an exemplary embodiment, the plurality of frames 120 and the plurality of slot support rails 110 are closed in the inward direction, and may have a form of being stacked side by side in the third direction z.

Accordingly, it is possible to minimize the slot pitch in the third direction z between the plurality of slot support rails 110 in the cassette according to an exemplary embodiment.

Figure 15:
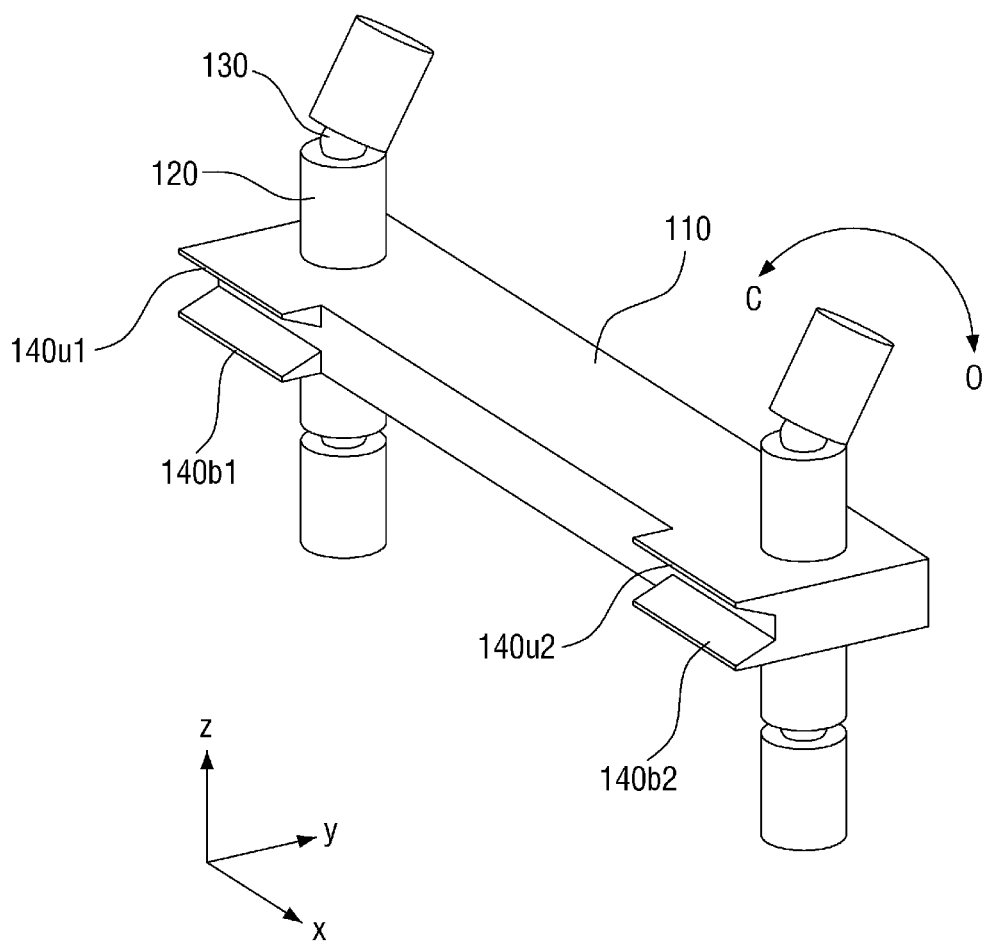
FIG. 15 is a schematic diagram with an enlarged view of a region SR of another cassette of FIG. 1 according to an exemplary embodiment.

FIG. 15 illustrates an enlarged view of a region SR of another cassette of FIG. 1 according to an exemplary embodiment.

Referring to FIG. 15, an enlarged region SR2 of another cassette according to an exemplary embodiment is different from that of FIG. 9 in that upper protrusions 140$u$1 and 140$u$2 and lower protrusions 140$b$1 and 140$b$2 may all be connected to each of the plurality of slot support rails 110. Repeated explanation of the aforementioned contents may be omitted or briefly described.

By forming the upper protrusions 140$u$1 and 140$u$2 and the lower protrusions 140$b$1 and 140$b$2 in each of the plurality of slot support rails 110, each of the plurality of slot support rails 110 may support lower faces of some of the plurality of substrates. Also, by forming the upper protrusions 140$u$1 and 140$u$2 and the lower protrusions 140$b$1 and 140$b$2 in each of the plurality of slot support rails 110, each of the plurality of slot support rails 110 may press the upper face of another substrate of the plurality of substrates. This will be explained in more detail through FIG. 16.

Figure 16:
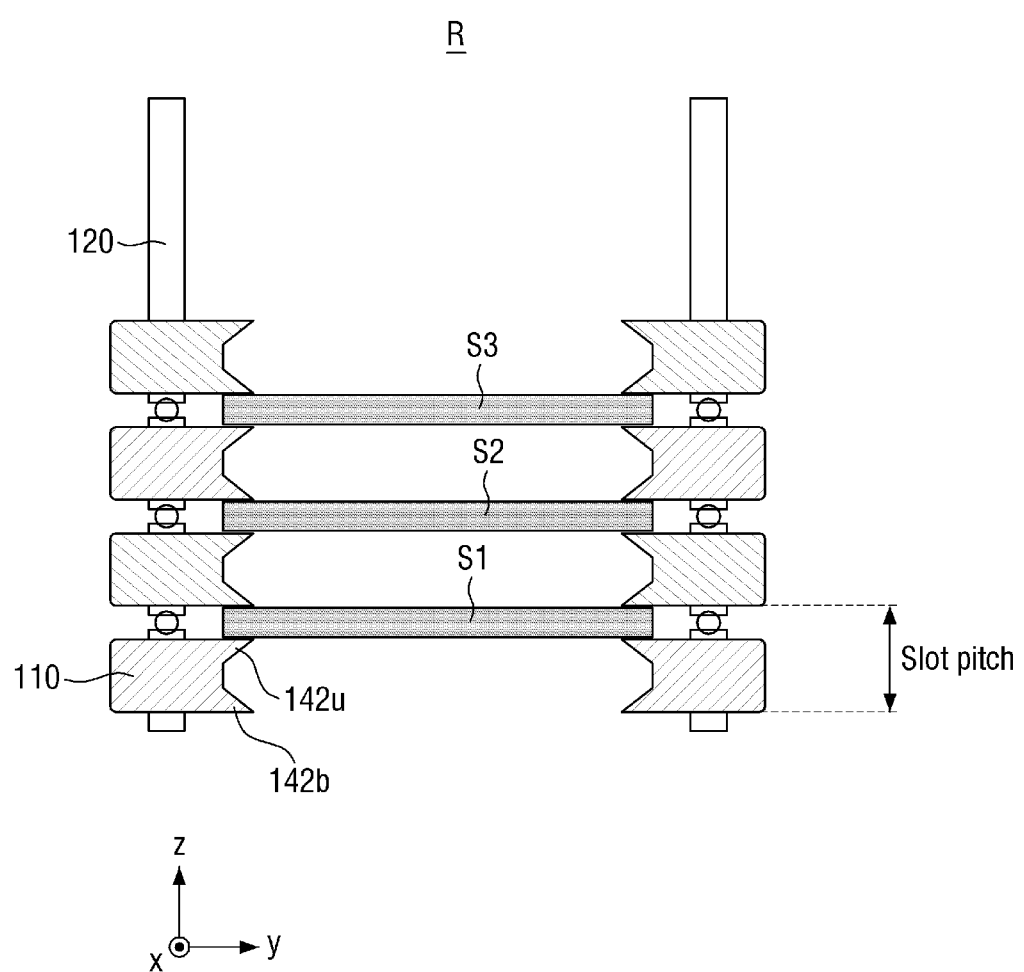
FIG. 16 is a cross-sectional diagram with view of a cassette to which the slot support of FIG. 15 may be applied, as viewed in a first x-axis direction.

FIG. 16 illustrates a cross-sectional view of a cassette to which the slot support of FIG. 15 according to an exemplary embodiment is applied, as viewed in a first direction (x direction).

Referring to FIG. 16, by forming the upper protrusions 140$u$1 and 140$u$2 and the lower protrusions 140$b$1 and 140$b$2 in each of the plurality of slot support rails 110, each of the plurality of slot support rails 110 may support the lower faces of some substrates among the plurality of substrates.

More specifically, when the upper protrusions 140$u$ of some of the plurality of slot support rails 110 support the lower faces of some substrate (e.g., S1) of the plurality of substrates, the lower protrusions 140$b$ of the same of the plurality of slot support rails 110 may press the upper faces of some other substrate (e.g., S2) of the plurality of substrates. That is, by forming the upper protrusions 140$u$1 and 140$u$2 and the lower protrusions 140$b$1 and 140$b$2 in each of the plurality of slot support rails 110, each of the plurality of slot support rails 110 may support the lower face of some substrate of the plurality of substrates. Also, by forming the upper protrusions 140$u$1 and 140$u$2 and the lower protrusions 140$b$1 and 140$b$2 in each of the plurality of slot support rails 110, each of the plurality of slot support rails 110 may press the upper face of another substrate of the plurality of substrates. Accordingly, the cassette of FIG. 16 according to an exemplary embodiment may have a smaller slot pitch than the cassette of FIG. 14 according to an exemplary embodiment.

Figure 17:
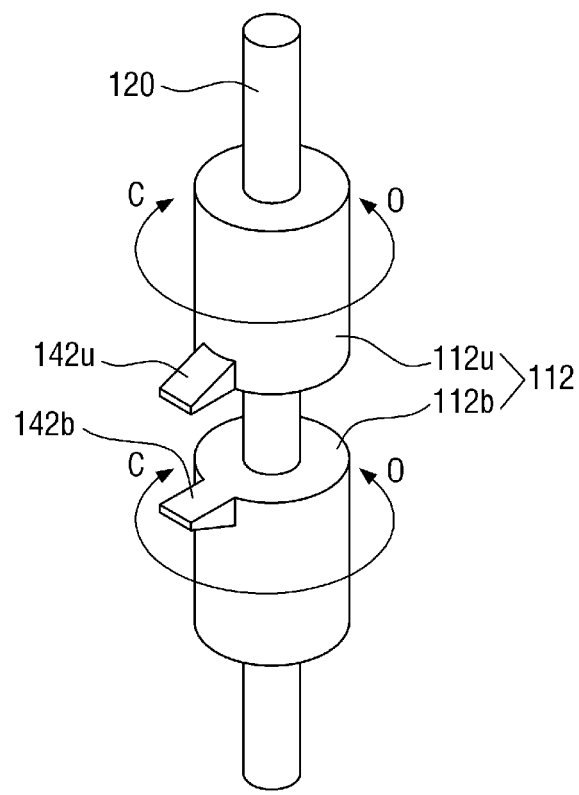
FIG. 17 is a schematic diagram with an enlarged view of a region SR of another cassette of FIG. 1 according to an exemplary embodiment.

FIG. 17 illustrates an enlarged view of a region SR of another cassette of FIG. 1 according to an exemplary embodiment.

Referring to FIG. 17, an enlarged region SR3 of another cassette according to an exemplary embodiment is different from that of FIG. 9 in that each of a plurality of slot support cams 112$u$ and 112$b$ may rotate clockwise or counterclockwise around each of the plurality of frames 120 as the axis, along the plane formed by the first direction x and the second direction y in which the substrate extends.

More specifically, the plurality of slot support cams 112$u$ and 112$b$ according to an exemplary embodiment includes a lower slot support cam 112$b$ and an upper slot support cam 112$u$. respectively, that are sequentially stacked in the third direction z.

The upper slot support cam 112$u$ and the lower slot support cam 112$b$ are connected to the frame and may rotate in the inward direction C and/or the outward direction O.

The upper slot support cam 112$u$ also includes an upper protrusion 142$u$. More specifically, the upper protrusion 142$u$ may protrude in the inward direction of the plurality of frames 120 in which the substrates are loaded. The upper protrusion 142$u$ may be connected to a lower part of the upper slot support cam 112$u$ in the third direction z. The upper protrusion 142$u$ may press the uppermost face of the substrate in the third direction z, after the substrate is loaded onto some of the plurality of slot support cams 112. The position at which the upper protrusion 142$u$ is connected to the upper slot support cam 112$u$ is not limited to that of this drawing, and the upper protrusion 142$u$ may be located anywhere in the upper slot support cam 112$u$ as long as the upper face of the substrate may be pressed. That is, the upper protrusions need not be flush with the ends of each support, and may allow for a rotating portion of the surface below that of the protrusion to be oblong or off-center rather than concentric and cylindrical, and positively center an edge of the substrate as the protrusion is rotated into place upon an upper surface of the substrate. Also, the shape of the upper protrusion 142$u$ is not limited to that of this drawing, and may be any shape as long as the upper face of the substrate may be pressed. For example, the upper protrusion may be beveled to apply increasing pressure to the upper surface of the substrate.

The lower slot support cam 112$b$ also includes a lower protrusion 142$b$. More specifically, the lower protrusion 142$b$ may protrude in the inward direction of the plurality of frames 120 in which the substrates are loaded. The lower protrusion 142$b$ may be connected to an upper part of the lower slot support cam 112b in the third direction z. The lower protrusion 142b may support the lowermost face of the substrate in the third direction z after the substrate is loaded onto some of the plurality of slot support cams 112. The position at which the lower protrusion 142b is connected to the lower slot support cam 112b is not limited to that of this drawing, and the lower protrusion 142b may be located anywhere in the lower slot support cam 112b as long as it may support the lower face of the substrate. That is, the lower protrusions need not be flush with the ends of each support, and may allow for a rotating portion of the surface above that of the protrusion to be oblong or off-center rather than concentric and cylindrical, and positively center an edge of the substrate as the protrusion is rotated into place upon a lower surface of the substrate. Also, the shape of the lower protrusion 142b is not limited to this drawing, and the lower protrusion 142b may have any shape as long as it may support the lower face of the substrate. For example, the lower protrusion may be beveled to apply increasing pressure to the lower surface of the substrate.

Figure 18:
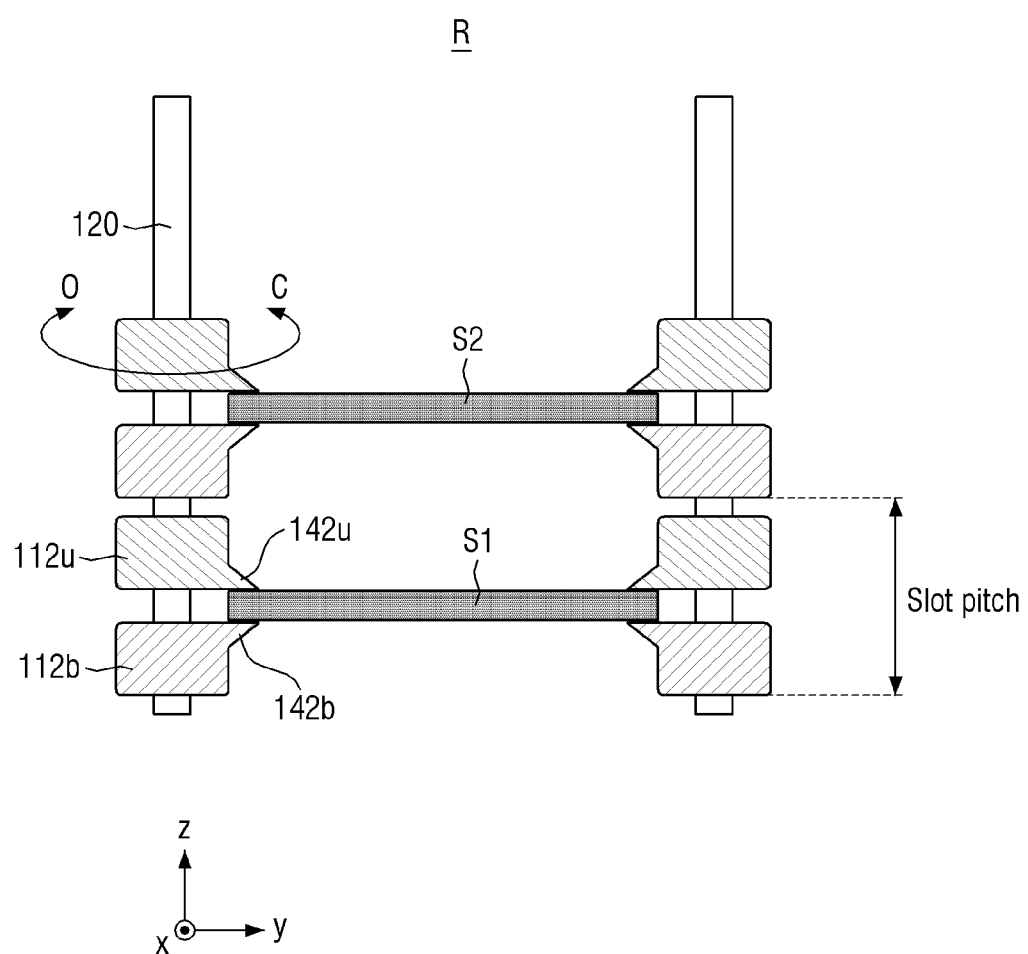
FIG. 18 is a cross-sectional diagram with view of a cassette to which the slot support of FIG. 17 is applied, as viewed in the first x-axis direction.

FIG. 18 illustrates a cross-sectional view of a cassette to which the slot support of FIG. 17 is applied according to an exemplary embodiment, as viewed in the first direction (x direction).

Referring to FIG. 18, unlike the cassette of FIGS. 10 to 14 according to an exemplary embodiment, the cassette may rotate in the inward direction C or the outward direction O.

That is, the frame and the slot support cams 112 of the cassette of FIGS. 17 and 18 according to an exemplary embodiment are similar to the operation of the cassette of FIGS. 10 to 14 except that the frame and the slot support cams 112 are opened in the outward direction O and closed in the inward direction C by rotating the slot support cams 112, such as while fixing the frame without limitation thereto.

That is, the slot pitch of the plurality of slot support cams 112 in the third direction z may be minimized through the structure of the cassette of FIGS. 17 and 18 according to an exemplary embodiment.

Figure 19:
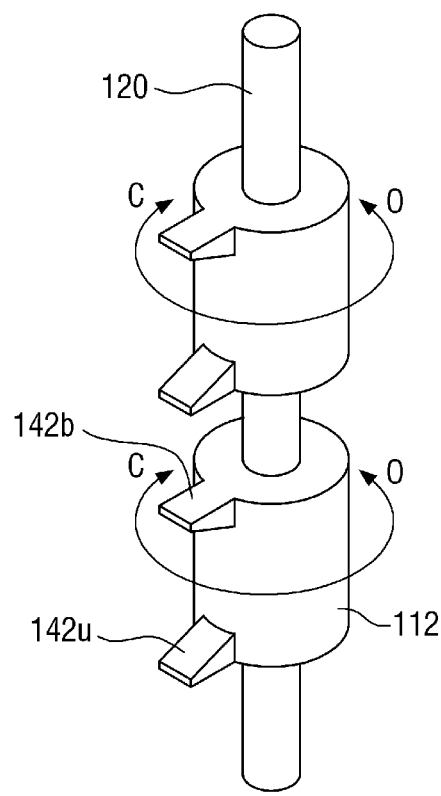
FIG. 19 is a schematic diagram with an enlarged view of the region SR of another cassette of FIG. 1 according to an exemplary embodiment.
Figure 20:
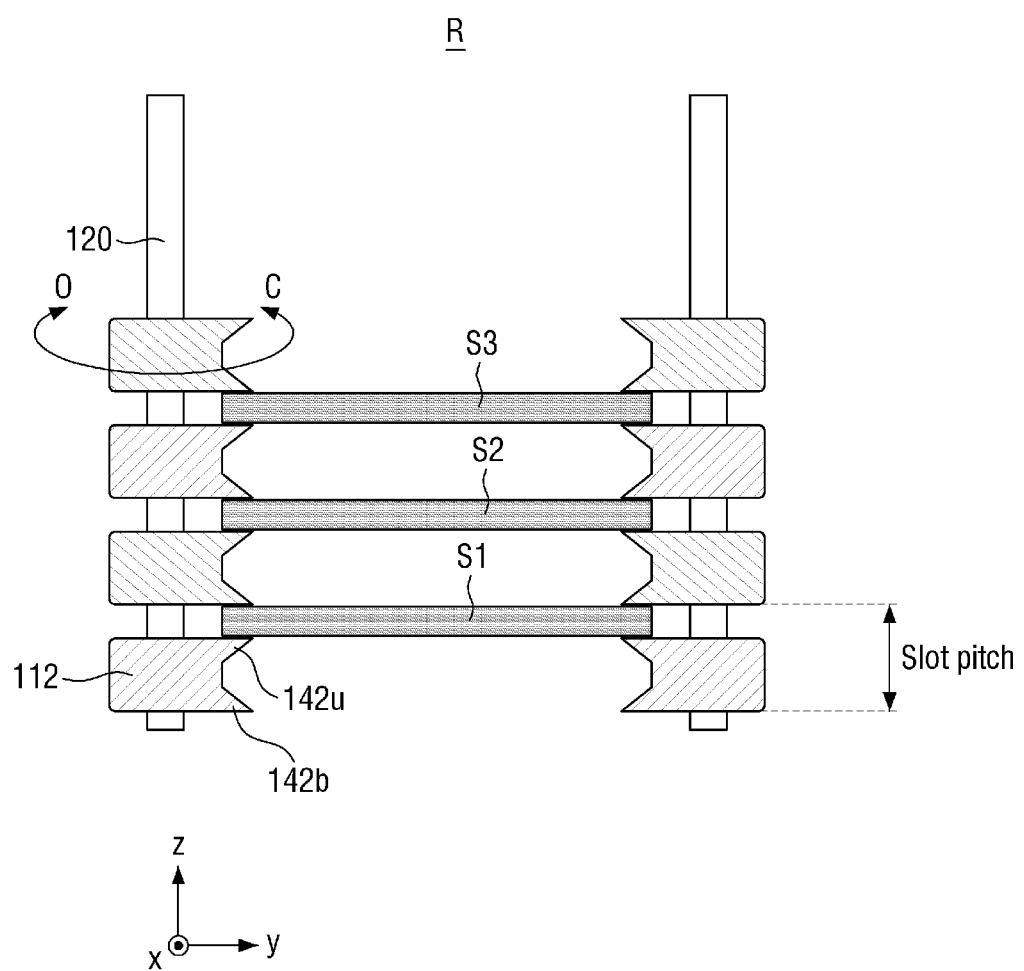
FIG. 20 is a cross-sectional diagram with view of a cassette to which the slot support of FIG. 19 is applied, as viewed in the first x-axis direction.

FIG. 19 illustrates an enlarged view of the region SR of another cassette of FIG. 1 according to an exemplary embodiment. FIG. 20 illustrates a cross-sectional view of a cassette to which the slot support of FIG. 19 is applied according to an exemplary embodiment, as viewed in the first direction (x direction).

Referring to FIGS. 19 and 20, an enlarged region SR4 of another cassette according to an exemplary embodiment is different from FIGS. 17 and 18 in that both an upper protrusion 142u and a lower protrusion 142b may be connected to each of the plurality of slot support cams 112. Repeated explanation of the aforementioned contents may be omitted or briefly described.

By forming the upper protrusion 142u and the lower protrusion 142b in each of the plurality of slot support cams 112, each of the plurality of slot support cams 112 may support the lower face of some of the plurality of substrates. In addition, by forming the upper protrusion 142u and the lower protrusion 142b in each of the plurality of slot support cams 112, each of the plurality of slot support cams 112 may press upper faces of the other substrate among the plurality of substrates.

More specifically, the upper protrusion 142u of some slot support of the plurality of slot support cams 112 may support the lower faces of some substrate (e.g., S1) of the plurality of substrates, and the lower protrusions 142b of the slot support of the plurality of slot support cams 112 may press the upper part of some other substrate (e.g., S2) of the plurality of substrates. That is, by forming the upper protrusion 142u and the lower protrusion 142b in each of the plurality of slot support cams 112, each of the plurality of slot support cams 112 may support the lower faces of some substrate of the plurality of substrates. In addition, by forming the upper protrusion 142u and the lower protrusion 142b in each of the plurality of slot support cams 112, each of the plurality of slot support cams 112 may press the upper face of other substrate among the plurality of substrates. Accordingly, the cassette of FIGS. 19 and 20 according to an exemplary embodiment may have a slot pitch smaller than the cassette of FIGS. 17 and 18.

The upper and lower protrusions need not be flush with the ends of each support, and may allow for a rotating portion of the surface supporting an edge of the substrate to be oblong or off-center rather than concentric and cylindrical, and operate to positively center an edge of the substrate in the x-y plane as the protrusion is rotated into place upon an upper and/or lower surface of the substrate. Also, the shape of the protrusions 142u and 142b are not limited to those of this drawing, and may be any shape as long as the upper and lower faces of the substrate may be pressed.

For example, the protrusions may be beveled with a screw pitch in one direction of rotation to apply increasing pressure to the upper and/or lower surfaces of the substrate as the protrusions are rotated further into place. Moreover, one protrusion, such as the lower protrusion 142b, may be padded or formed of a relatively elastic material, while the other protrusion, such as the upper protrusion 142u may unpadded or formed of a relatively rigid material.

That is, the cassette 110 of FIGS. 1, 19 and 20 may be configured with one or more of: a slot support of the plurality of slot supports rotates on an axis normal to the substrate, at least one of the upper or lower protrusions of the slot support is not flush with either end of the slot support, a cross-section of the slot support has an increasing radius in a plane of the substrate in a portion of the slot support between a protrusion and a respective end of the slot support, at least one of the upper or lower protrusions of the slot support is beveled to apply gradually increasing pressure to an upper and/or lower surface of the substrate as the slot support is rotated, or at least one of the upper or lower protrusions is padded or formed of a relatively more elastic material than the other of the upper or lower protrusions In concluding the detailed description, those of ordinary skill in the pertinent art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor processing cassette configured to receive a semiconductor substrate, comprising:
a plurality of slot supports stacked in a first direction; and
a frame having a plurality of frame segments and a plurality of independently rotating units, each of the plurality of frame segments respectively connected to a respective one of the plurality of slot supports and extending in the first direction,
wherein the plurality of slot supports and the plurality of frame segments are opened in an outward direction to receive the substrate, and are partially closed in an inward direction after the substrate is received.

2. The cassette of claim 1, wherein the plurality of slot supports has a stepped shape.

3. The cassette of claim 1,
wherein each of the plurality of frame segments is connected to a respective one of the plurality of independently rotating units between each respective slot support in the first direction, and rotates in the outward direction and the inward direction.

4. The cassette of claim 1, wherein:
each of the plurality of slot supports includes a lower slot support and an upper slot support, which are sequentially stacked in the first direction,
the lower slot support includes a lower protrusion extending in the inward direction,
the upper slot support includes an upper protrusion extending in the inward direction,
the lower protrusion supports a lower face of the substrate, and
the upper protrusion presses an upper face of the substrate.

5. The cassette of claim 1, wherein:
each of the plurality of slot supports includes a lower protrusion extending in the inward direction, and an upper protrusion extending in the inward direction, and
the plurality of slot supports presses an edge of the substrate.

6. The cassette of claim 1, wherein the frame is made of an elastic material, and is bendable in the outward direction and the inward direction.

7. The cassette of claim 1, wherein the plurality of slot supports and the frame are opened and closed in a second direction which intersects the first direction and along which the substrate extends, based on the first direction.

8. The cassette of claim 1, wherein the plurality of slot supports rotates around the frame at the plurality of independently rotating units, respectively, in the outward direction or the inward direction, in a direction along which the substrate extends.

9. The cassette of claim 8, wherein:
each of the plurality of slot supports includes a lower slot support and an upper slot support, which are sequentially stacked in the first direction,
the lower slot support includes a lower protrusion extending in the inward direction,
the upper slot support includes an upper protrusion extending in the inward direction,
the lower protrusion supports a lower face of the substrate, and
the upper protrusion presses an upper face of the substrate.

10. The cassette of claim 8, wherein:
each of the plurality of slot supports includes a lower protrusion extending in the inward direction, and an upper protrusion extending in the inward direction, and
the plurality of slot supports presses an edge of the substrate.

11. A substrate receiving system including a chamber configured to receive a semiconductor processing cassette in which a semiconductor substrate is loaded,
wherein the cassette includes:
a plurality of slot supports stacked in a first direction,
a frame having a plurality of frame segments respectively connected to the plurality of slot supports and extending in the first direction, and
a plurality of rotating units respectively disposed between the plurality of slot supports and the plurality of frame segments,
wherein the plurality of slot supports and the frame are opened in an outward direction to receive the substrate, and closed in an inward direction after the substrate is received.

12. The substrate receiving system of claim 11, wherein the cassette is inserted into the chamber after the substrate is loaded from outside of the chamber.

13. The substrate receiving system of claim 11, wherein the frame is connected to the plurality of rotating units and rotates in the outward direction and the inward direction.

14. The substrate receiving system of claim 11, wherein:
each of the plurality of slot supports includes a lower slot support and an upper slot support, which are sequentially stacked in the first direction,
the lower slot support includes a lower protrusion extending in the inward direction,
the upper slot support includes an upper protrusion extending in the inward direction,
the lower protrusion supports a lower face of the substrate, and
the upper protrusion presses an upper face of the substrate.

15. The substrate receiving system of claim 11, wherein:
each of the plurality of slot supports includes a lower protrusion extending in the inward direction, and an upper protrusion extending in the inward direction, and
at least one of the plurality of slot supports presses an edge of the substrate.

16. The substrate receiving system of claim 11, wherein the frame is made of an elastic material, and is bendable in the outward direction and the inward direction.

17. The substrate receiving system of claim 11, wherein the plurality of slot supports and the frame are opened and closed in a second direction which intersects the first direction and along which the substrate extends, based on the first direction.

18. A semiconductor processing cassette configured to receive a semiconductor substrate, comprising:
a plurality of independently rotating slot supports stacked in a first direction,
wherein some of the plurality of independently rotating slot supports are opened in an outward direction, different than the first direction, and the substrate is loaded onto some other of the plurality of independently rotating slot supports, and
after the substrate is loaded, the some of the plurality of independently rotating slot supports are closed in an inward direction, different than the first direction, along which the substrate is loaded to press at least a part of the substrate.

19. The cassette of claim 18, wherein:
each of the plurality of independently rotating slot supports incudes a lower independently rotating slot support and an upper independently rotating slot support, which are sequentially stacked in the first direction,
the lower independently rotating slot support includes a lower protrusion extending in the inward direction,
the upper independently rotating slot support includes an upper protrusion extending in the inward direction,
the lower protrusion supports a lower face of the substrate, and
the upper protrusion presses an upper face of the substrate.

20. The cassette of claim 18, wherein:
each of the plurality of independently rotating slot supports includes a lower protrusion extending in the inward direction, and an upper protrusion extending in the inward direction, and
at least one of the plurality of independently rotating slot supports presses an edge of the substrate.

\* \* \* \* \*